United States Patent
Kohinata et al.

(10) Patent No.: US 11,104,771 B2
(45) Date of Patent: Aug. 31, 2021

(54) RESIN FILM, LAMINATED FILM, AND SUBSTRATE FOR FLEXIBLE PRINTED WIRING BOARD

(71) Applicant: Sumitomo Chemical Company, Limited, Tokyo (JP)

(72) Inventors: Yusaku Kohinata, Tsukuba (JP); Kazuyuki Ito, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 188 days.

(21) Appl. No.: 16/076,612

(22) PCT Filed: Feb. 9, 2017

(86) PCT No.: PCT/JP2017/004708
§ 371 (c)(1),
(2) Date: Aug. 8, 2018

(87) PCT Pub. No.: WO2017/138599
PCT Pub. Date: Aug. 17, 2017

(65) Prior Publication Data
US 2020/0165395 A1 May 28, 2020

(30) Foreign Application Priority Data

Feb. 10, 2016 (JP) .............................. JP2016-023701
Jul. 14, 2016 (JP) .............................. JP2016-139739

(51) Int. Cl.
| | | |
|---|---|---|
| *C09D 181/06* | (2006.01) | |
| *C08K 5/41* | (2006.01) | |
| *C08J 5/18* | (2006.01) | |
| *H05K 1/03* | (2006.01) | |
| *C08K 5/375* | (2006.01) | |

(52) U.S. Cl.
CPC ................. *C08J 5/18* (2013.01); *C08K 5/375* (2013.01); *C08K 5/41* (2013.01); *C09D 181/06* (2013.01); *H05K 1/0333* (2013.01); *C08J 2381/06* (2013.01); *H05K 1/0393* (2013.01)

(58) Field of Classification Search
CPC ........ C08G 65/40; C08L 81/06; C09D 181/06
USPC ....................................................... 528/373
See application file for complete search history.

(56) References Cited

U.S. PATENT DOCUMENTS

| | | |
|---|---|---|
| 2011/0224386 A1 | 9/2011 | Weber et al. |
| 2012/0149796 A1 | 6/2012 | Weber et al. |
| 2012/0190764 A1 | 7/2012 | Kohinata et al. |

FOREIGN PATENT DOCUMENTS

| | | | |
|---|---|---|---|
| EP | 2042557 A1 | 4/2009 | |
| JP | 63-095231 A | 4/1988 | |
| JP | 64-043524 A | 2/1989 | |
| JP | 01-263121 A | 10/1989 | |
| JP | 01-319530 A | * 12/1989 | |
| JP | 08-174632 A | 7/1996 | |
| JP | 10-182855 A | 7/1998 | |
| JP | 11-167022 A | 6/1999 | |
| JP | 11-167023 A | 6/1999 | |
| JP | 2003-321556 A | 11/2003 | |
| JP | 2012-509375 A | 4/2012 | |
| JP | 2013-502476 A | 1/2013 | |
| JP | 2014098137 A | 5/2014 | |
| WO | WO 00/00537 | * 1/2000 | |

OTHER PUBLICATIONS

Machine translation of JP 01-319530 A (no date).*
Int'l Search Report dated May 9, 2017 in Int'l Application No. PCT/JP2017/004708.
Elias, Hans-George, "Under Macromolecular Synthesis, Materials and Technology," translated by Institute of Materials Science, Fudan University, Shanghai Science and Technology Publishing House, pp. 385-388 (1986).
Office Action dated Sep. 9, 2020 in CN Application No. 201780010261.3 (with English Machine Translation).
Office Action dated Jun. 2, 2020 in JP Application No. 2016139739 (with English Machine Translation).

* cited by examiner

*Primary Examiner* — Marc S Zimmer
(74) *Attorney, Agent, or Firm* — Panitch Schwarze Belisario & Nadel LLP

(57) ABSTRACT

A resin film having an aromatic polysulfone as a forming material is provided. The resin film has a thickness of less than 100 μm, and further contains an organic compound having a boiling point no lower than 250° C. and no higher than 400° C. The organic compound is contained in an amount of at least 500 ppm and at most 4000 ppm relative to the mass of the aromatic polysulfone.

6 Claims, 1 Drawing Sheet

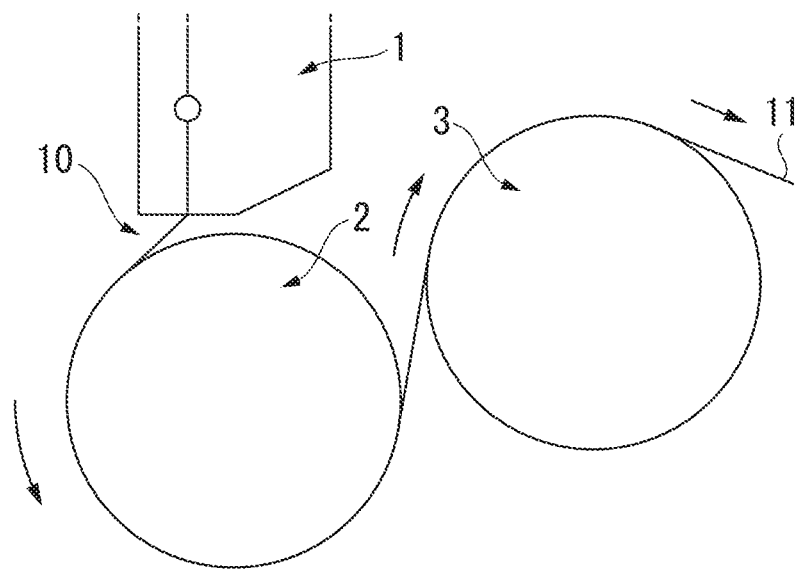

RESIN FILM, LAMINATED FILM, AND SUBSTRATE FOR FLEXIBLE PRINTED WIRING BOARD

CROSS-REFERENCE TO RELATED APPLICATION

This application is a Section 371 of International Application No. PCT/JP2017/004708, filed Feb. 9, 2017, which was published in the Japanese language on Aug. 17, 2017, under International Publication No. WO 2017/138599 A1.

TECHNICAL FIELD

The present invention relates to a resin film, a laminated film, and a substrate for a flexible printed wiring board.

The present application claims priority on Japanese Patent Application No. 2016-23701, filed Feb. 10, 2016, and Japanese Patent Application No. 2016-139739, filed Jul. 14, 2016, the contents of which are incorporated herein by reference.

BACKGROUND ART

Aromatic polysulfones have excellent heat resistance and chemical resistance, and are therefore used in various applications as a material for use in molded bodies. Aromatic polysulfones are normally produced by subjecting aromatic dihalogenosulfone compounds and aromatic dihydroxy compounds to a polycondensation reaction in the co-presence of a base and a reaction solvent (see, e.g., Patent Documents 1 and 2).

The reaction mixture obtained by the above-mentioned polycondensation reaction contains aromatic polysulfones, unreacted bases, byproducts (halogenated alkalis when an alkali metal salt is used as the base), and the reaction solvent. Normally, a method is used to isolate the aromatic polysulfones from this reaction mixture, resulting in a state in which only small amounts of the unreacted bases, byproducts and reaction solvents remain.

Patent Document 3 discloses a method wherein non-solvents such as alcohol and water are used to remove byproducts and solvents from a polymer mixture, and thereafter, the bulk density of aromatic polyether polymers is increased in a mixed solvent containing an aliphatic alcohol and a ketone.

Patent Document 4 discloses a method wherein a polymer mixture is pulverized in a non-solvent, and thereafter heated under reduced pressure at a temperature lower than the glass transition temperature or the melting point of the polymer mixture and equal to or higher than the vapor pressure temperature of the reaction solvent.

Patent Document 5 discloses a method wherein a mixed solvent containing a specific solvent such as 1,3-dimethyl-2-imidazolidinone and a non-solvent of aromatic polyether polymers is added to a crude reaction solution after the removal of byproduct salts, and aromatic polyether polymers are precipitated in the non-solvent, then washed.

RELATED LITERATURE

Patent Literature

[Patent Document 1]
  JP 2012-509375 A
[Patent Document 2]
  JP 2013-502476 A
[Patent Document 3]
  JP S64-043524 A
[Patent Document 4]
  JP H1-263121 A
[Patent Document 5]
  JP S63-095231 A

SUMMARY OF INVENTION

Technical Problem

However, resin films having conventional aromatic polysulfones such as those described in Patent Documents 1-5 as forming materials do not necessarily have sufficient mechanical strength, such as toughness. Therefore, improvements in the mechanical strength of resin films having aromatic polysulfones as forming materials are sought.

The present invention was made in view of these circumstances, and has, as one purpose, that of providing a resin film having excellent mechanical strength, such as toughness. Additionally, another purpose is that of providing a laminated film having excellent mechanical strength, such as toughness, and containing this resin film. Furthermore, another purpose is that of providing a substrate for a flexible printed wiring board having excellent mechanical strength, such as toughness, and containing this laminated film.

Solution to Problem

In order to solve the above-mentioned problem, an embodiment of the present invention provides a resin film having an aromatic polysulfone as a forming material, wherein the resin film has a thickness of less than 100 µm; the resin film further contains an organic compound having a boiling point no lower than 250° C. and no higher than 400° C.; and the organic compound is contained in an amount of at least 500 ppm and at most 4000 ppm relative to the mass of the aromatic polysulfone.

In one embodiment of the present invention, it is preferable for the aromatic polysulfone to have repeating units expressed by formula (1), the repeating units expressed by formula (1) constituting 80 to 100 mol % of a total amount of all repeating units constituting the aromatic polysulfone:

$$-Ph^1-SO_2-Ph^2-O- \qquad (1)$$

where, in formula (1), $Ph^1$ and $Ph^2$ represent phenylene groups, in which one or more hydrogen atoms that bind to the phenylene groups may, independently of each other, be substituted with an alkyl group having 1 to 10 carbon atoms, an aryl group having 6 to 20 carbon atoms, or a halogen atom.

In one embodiment of the present invention, the organic compound has, as Hansen solubility parameters, a dispersion parameter $\delta D$ (units: $MPa^{0.5}$) of at least 16.0 and at most 22.0, a polarity parameter $\delta P$ (units: $MPa^{0.5}$) of at least 12.0 and at most 16.4, and a hydrogen bonding parameter $\delta H$ (units: $MPa^{0.5}$) of at least 3.0 and at most 12.0.

In one embodiment of the present invention, the organic compound is an aprotic polar solvent.

In one embodiment of the present invention, the organic compound is diphenyl sulfone.

One embodiment of the present invention provides a laminated film having a layer including the resin film as described above, and a layer including a conductor.

One embodiment of the present invention provides a substrate for a flexible printed wiring board, including the laminated film as described above.

In other words, the present invention has the following embodiments.
<1> A resin film having an aromatic polysulfone as a forming material, wherein:
the resin film has a thickness of less than 100 m;
the resin film further contains an organic compound having a boiling point no lower than 250° C. and no higher than 400° C.; and
the organic compound is contained in an amount of at least 500 ppm and at most 4000 ppm relative to the mass of the aromatic polysulfone.
<2> The resin film according to <1>, wherein the aromatic polysulfone has repeating units expressed by formula (1), the repeating units expressed by formula (1) constituting 80 to 100 mol % of a total amount of all repeating units constituting the aromatic polysulfone:

$$-Ph^1-SO_2-Ph^2-O— \quad (1)$$

where, in formula (1), $Ph^1$ and $Ph^2$ represent phenylene groups, in which one or more hydrogen atoms that bind to the phenylene groups may, independently of each other, be substituted with an alkyl group having 1 to 10 carbon atoms, an aryl group having 6 to 20 carbon atoms, or a halogen atom.
<3> The resin film according to <1> or <2>, wherein the organic compound has, as Hansen solubility parameters, a dispersion parameter δD (units: $MPa^{0.5}$) of at least 16.0 and at most 22.0, a polarity parameter δP (units: $MPa^{0.5}$) of at least 12.0 and at most 16.4, and a hydrogen bonding parameter δH (units: $MPa^{0.5}$) of at least 3.0 and at most 12.0.
<4> The resin film according to any one of <1> to <3>, wherein the organic compound is an aprotic polar solvent.
<5> The resin film according to any one of <1> to <4>, wherein the organic compound is diphenyl sulfone.
<6> A laminated film having a layer including the resin film according to any one of <1> to <5>, and a layer including a conductor.
<7> A substrate for a flexible printed wiring board, including the laminated film according to <6>.

Advantageous Effects of Invention

According to one embodiment of the present invention, a resin film having excellent mechanical strength, such as toughness, is provided.

Additionally, a laminated film having excellent mechanical strength, such as toughness, and containing this resin film is provided. Furthermore, a substrate for a flexible printed wiring board having excellent mechanical strength, such as toughness, and containing this laminated film is provided.

BRIEF DESCRIPTION OF DRAWINGS

FIG. 1 is a schematic view showing an example of the arrangement of an apparatus used when producing the resin film according to the present embodiment by means of melt extrusion.

DESCRIPTION OF EMBODIMENTS

<Resin Film>
The resin film according to the present embodiment is a film having an aromatic polysulfone as a forming material, wherein the resin film has a thickness of less than 100 μm. The resin film further includes an organic compound (hereinafter sometimes referred to as "compound A") having a boiling point no lower than 250° C. and no higher than 400° C., and compound A is contained in an amount of at least 500 ppm and at most 4000 ppm, preferably at least 600 ppm and at most 3500 ppm, more preferably at least 700 ppm and at most 3200 ppm, and even more preferably at least 800 ppm and at most 3000 ppm relative to the mass of the aromatic polysulfone.

One aspect of the present invention is a resin film obtained by molding an aromatic polysulfone composition containing an aromatic polysulfone and an organic compound having a boiling point no lower than 250° C. and no higher than 400° C., wherein the organic compound is contained in an amount of at least 500 ppm and at most 4000 ppm relative to the mass of the aromatic polysulfone, and the resin film has a thickness of less than 100 μm.

[Aromatic Polysulfone]
In the present embodiment, the aromatic polysulfone typically is a resin having repeating units including a divalent aromatic group (a residue obtained by removing, from an aromatic compound, two hydrogen atoms bonded to the aromatic ring thereof), a sulfonyl group (—$SO_2$—), and an oxygen atom. Examples of divalent aromatic groups include phenylene groups, naphthalene diyl groups and the like, preferable examples of which are phenylene groups. These groups may have substituent groups.

The aromatic polysulfone preferably has the repeating units expressed by formula (1) (hereinafter sometimes referred to as "repeating unit (1)"), in view of the heat resistance and the chemical resistance. Aromatic polysulfones having the repeating units (1) are sometimes referred to as aromatic polyethersulfones. The aromatic polysulfones may further have one or more other repeating units such as the repeating units expressed by formula (2) (hereinafter sometimes referred to as "repeating unit (2)"), the repeating units expressed by formula (3) (hereinafter sometimes referred to as "repeating unit (3)") or the like.

$$-Ph^1-SO_2-Ph^2-O— \quad (1)$$

In formula (1), $Ph^1$ and $Ph^2$ represent phenylene groups, in which one or more hydrogen atoms that bind to the phenylene groups may, independently of each other, be substituted with an alkyl group having 1 to 10 carbon atoms, an aryl group having 6 to 20 carbon atoms, or a halogen atom.

$$Ph^3-R-Ph^4-O— \quad (2)$$

In formula (2), $Ph^3$ and $Ph^4$ represent phenylene groups, in which one or more hydrogen atoms in the phenylene groups may, independently of each other, be substituted with an alkyl group having 1 to 10 carbon atoms, an aryl group having 6 to 20 carbon atoms, or a halogen atom. R represents an alkylidene group having 1 to 5 carbon atoms, an oxygen atom or a sulfur atom.

$$(Ph^5)_n—O— \quad (3)$$

In formula (3), $Ph^5$ represents a phenylene group, in which one or more hydrogen atoms in the phenylene groups may, independently of each other, be substituted with an alkyl group having 1 to 10 carbon atoms, an aryl group having 6 to 20 carbon atoms, or a halogen atom. n represents an integer from 1 to 3, and when n is 2 or more, the multiple units $Ph^5$ may be identical to or different from each other.

The phenylene groups represented by one of $Ph^1$ to $Ph^5$ are, independently of each other, p-phenylene groups, m-phenylene groups or o-phenylene groups, among which p-phenylene groups are preferred.

Examples of alkyl groups having 1 to 10 carbon atoms that may substitute hydrogen atoms in the phenylene groups include methyl groups, ethyl groups, n-propyl groups, isopropyl groups, n-butyl groups, isobutyl groups, sec-butyl groups, tert-butyl groups, n-pentyl groups, n-hexyl groups, n-heptyl groups, 2-ethylhexyl groups, n-octyl groups and n-decyl groups.

Examples of aryl groups having 6 to 20 carbon atoms that may substitute hydrogen atoms in the phenylene groups include phenyl groups, o-tolyl groups, m-tolyl groups, p-tolyl groups, 1-napththyl groups and 2-napththyl groups.

Examples of halogen atoms that may substitute hydrogen atoms in the phenylene groups include fluorine atoms, chlorine atoms, bromine atoms and iodine atoms.

When the hydrogen atoms in the phenylene groups are substituted by these groups, the number thereof is preferably two or less, more preferably one, in each of the phenylene groups, independently of each other.

Examples of the alkylidene group having 1 to 5 carbon atoms represented by R include methylene groups, ethylidene groups, isopropylidene groups and 1-butylidene groups.

The repeating units (1) are preferably contained in an amount of 50 to 100 mol %, more preferably 80 to 100 mol %, with respect to the total amount, i.e., the total number of moles, of all repeating units constituting the aromatic polysulfone, and it is more preferable for the repeating units to substantially include only the repeating units (1). The aromatic polysulfone may contain two or more types of the repeating units (1) to (3), independently of each other.

The reduced viscosity (units: dL/g) of the aromatic polysulfone of the present embodiment is preferably at least 0.30, more preferably at least 0.40 and at most 0.80. In other words, the reduced viscosity (units: dL/g) of the aromatic polysulfone is preferably at least 0.30 and at most 0.80, more preferably at least 0.40 and at most 0.80. In the present specification, the reduced viscosity can be measured by means of the method described in the examples below. For the aromatic polysulfone, the mechanical strength, such as toughness, when a resin film is formed tends to improve as the reduced viscosity becomes higher. However, if the reduced viscosity is too high, the melting temperature and melt viscosity tend to become higher, and the fluidity tends to become lower.

[Compound A]

The boiling point of compound A according to the present embodiment is no lower than 250° C. and no higher than 400° C., preferably no lower than 350° C. and no higher than 400° C.

In the present specification, the boiling point can be measured by applying a known method. Alternatively, in the case of a single compound, it is possible to refer to the values described in a document such as a chemical handbook. The boiling points used in the present specification are the values as measured at 1 atmosphere.

Of the Hansen solubility parameters of compound A, the dispersion parameter $\delta D$ (units: $MPa^{0.5}$) is preferably at least 16.0 and at most 22.0, more preferably at least 16.0 and at most 20.0, and even more preferably at least 16.0 and at most 19.0.

In another aspect of the present invention, of the Hansen solubility parameters of compound A, the dispersion parameter $\delta D$ (units: $MPa^{0.5}$) is preferably at least 18.0 and at most 22.0, and more preferably at least 19.0 and at most 22.0.

Of the Hansen solubility parameters of compound A, the polarity parameter $\delta P$ (units: $MPa^{0.5}$) is preferably at least 12.0 and at most 16.4, more preferably at least 12.0 and at most 15.0, and even more preferably at least 12.0 and at most 14.5.

Of the Hansen solubility parameters of compound A, the hydrogen bonding parameter $\delta H$ (units: $MPa^{0.5}$) is preferably at least 3.0 and at most 12.0, more preferably at least 3.0 and at most 8.0, and even more preferably at least 7.0 and at most 8.0.

In another aspect of the present invention, of the Hansen solubility parameters of compound A, the hydrogen bonding parameter $\delta H$ (units: $MPa^{0.5}$) is at least 3.0 and at most 4.0.

As the Hansen solubility parameters, it is preferable for the dispersion parameter $\delta D$ (units: $MPa^{0.5}$) to be at least 16.0 and at most 22.0, the polarity parameter $\delta P$ (units: $MPa^{0.5}$) to be at least 12.0 and at most 16.4, and the hydrogen bonding parameter $\delta H$ (units: $MPa^{0.5}$) to be at least 3.0 and at most 12.0. As the Hansen solubility parameters, it is more preferable for the dispersion parameter $\delta D$ (units: $MPa^{0.5}$) to be at least 18.0 and at most 22.0, the polarity parameter $\delta P$ (units: $MPa^{0.5}$) to be at least 12.0 and at most 15.0, and the hydrogen bonding parameter $\delta H$ (units: $MPa^{0.5}$) to be at least 3.0 and at most 8.0. Among these, as the Hansen solubility parameters, it is even more preferable for the dispersion parameter $\delta D$ (units: $MPa^{0.5}$) to be at least 19.0 and at most 22.0, the polarity parameter $\delta P$ (units: $MPa^{0.5}$) to be at least 12.0 and at most 14.5, and the hydrogen bonding parameter $\delta H$ (units: $MPa^{0.5}$) to be at least 3.0 and at most 4.0.

The Hansen solubility parameters are useful for predicting the ability of a solvent material to dissolve a specific solute. The dispersion parameter $\delta D$ represents the energy due to the dispersive force between the molecules, the polarity parameter $\delta P$ represents the energy due to the polar force between the molecules, and the hydrogen bonding parameter $\delta H$ represents the energy due to the hydrogen bonding force.

The Hansen solubility parameters can be calculated from chemical formulas, for example, by using the computer software, "Hansen Solubility Parameters in Practice" (HSPiP). In the present invention, it is possible to use the values provided in the HSPiP ver. 5.0.03 database for the compounds registered therein, and values obtained by calculation using HSPiP ver. 5.0.03 for compounds not in the database.

Compound A is preferably an aprotic polar solvent, and is more preferably an aprotic polar solvent for which the Hansen solubility parameters satisfy the above-mentioned conditions. Examples thereof include sulfones such as dimethyl sulfone, diethyl sulfone, diisopropyl sulfone and diphenyl sulfone. Compound A is preferably an aprotic polar solvent for which the Hansen solubility parameters satisfy the above-mentioned conditions, an example thereof being diphenyl sulfone. Table 1 shows the values of the Hansen solubility parameters (dispersion parameter $\delta D$, polarity parameter $\delta P$ and hydrogen bonding parameter $\delta H$) for diphenyl sulfone.

TABLE 1

| | Hansen Solubility Parameters | | |
|---|---|---|---|
| | $\delta D$ ($MPa^{0.5}$) | $\delta P$ ($MPa^{0.5}$) | $\delta H$ ($MPa^{0.5}$) |
| Diphenyl sulfone | 21.1 | 14.4 | 3.4 |

Additionally, the boiling point of diphenyl sulfone is 378° C.

In the present embodiment, compound A may be a single type used alone, or a combination of two or more types.

[Resin Film Production Method]

The resin film according to the present embodiment is formed from a composition containing an aromatic polysulfone and compound A. Examples of the resin film production method include solution casting method and melt extrusion method, explained below. This composition contains compound A in an amount of at least 500 ppm and at most 4000 ppm, preferably at least 600 ppm and at most 3500 ppm, more preferably at least 700 ppm and at most 3200 ppm, and even more preferably at least 800 ppm and at most 3000 ppm relative to the mass of the aromatic polysulfone. If the amount of compound A that is contained relative to the mass of the aromatic polysulfone is at least 500 ppm, compound A functions adequately as a plasticizer, and thus has excellent mechanical strength, such as toughness, when a resin film is formed therefrom. On the other hand, if the amount of compound A that is contained relative to the mass of the aromatic polysulfone exceeds 4000 ppm, the mechanical strength, such as toughness, when a resin film is formed therefrom, becomes worse. In other words, if the amount of compound A that is contained relative to the mass of the aromatic polysulfone is at most 4000 ppm, excellent mechanical strength, such as toughness, is obtained when a resin film is formed therefrom. Therefore, by containing compound A in the above-mentioned range, the composition according to the present embodiment achieves excellent mechanical strength, such as toughness, when a resin film is formed therefrom. In the present specification, the toughness can be measured by means of the method described in the examples described below.

(Composition)

Herebelow, an example of a method for producing the composition according to the present embodiment will be explained in detail.

The method for producing the composition according to the present embodiment is a method wherein the composition is produced by blending an aromatic dihalogenosulfone compound, an aromatic dihydroxy compound, a base and an organic solvent, and inducing a polycondensation reaction between the aromatic dihalogenosulfone compound and the aromatic dihydroxy compound.

The aromatic dihalogenosulfone compound and the aromatic dihydroxy compound correspond to the repeating units forming the aromatic polysulfone. The aromatic dihalogenosulfone compound may only be a compound having, in one molecule, an aromatic ring, a sulfonyl group ($-SO_2-$), and two halogeno groups. The aromatic dihydroxy compound may only be a compound having, in one molecule, an aromatic ring and two hydroxy groups.

For example, an aromatic polysulfone having the repeating units (1) can be produced by inducing a polycondensation reaction between a compound expressed by formula (4) (hereinafter sometimes referred to as "compound (4)") and a compound expressed by formula (5) (hereinafter sometimes referred to as "compound (5)").

An aromatic polysulfone having the repeating units (1) and the repeating units (2) can be produced by inducing a polycondensation reaction between compound (4) and a compound expressed by formula (6) (hereinafter sometimes referred to as "compound (6)").

An aromatic polysulfone having the repeating units (1) and the repeating units (3) can be produced by inducing a polycondensation reaction between compound (4) and a compound expressed by formula (7) (hereinafter sometimes referred to as "compound (7)").

$$X^1\text{-}Ph^1\text{-}SO_2\text{-}Ph^2\text{-}X^2 \qquad (4)$$

In formula (4), $X^1$ and $X^2$, independently of each other, represent halogen atoms. $Ph^1$ and $Ph^2$ are as defined above.

$$HO\text{-}Ph^1\text{-}SO_2\text{-}Ph^2\text{-}OH \qquad (5)$$

In formula (5), $Ph^1$ and $Ph^2$ are as defined above.

$$HO\text{-}Ph^3\text{-}R\text{-}Ph^4\text{-}OH \qquad (6)$$

In formula (6), $Ph^3$, $Ph^4$ and R are as defined above.

$$HO-(Ph^5)_n-OH \qquad (7)$$

In formula (7), $Ph^5$ and n are as defined above.

In formula (4), $X^1$ and $X^2$, independently of each other, represent halogen atoms, examples of which are the same as the aforementioned halogen atoms that may substitute hydrogen atoms in the phenylene groups.

Examples of compound (4) include bis(4-chlorophenyl) sulfone and 4-chlorophenyl-3',4'-dichlorophenyl sulfone.

Examples of compound (5) include bis(4-hydroxyphenyl) sulfone, bis(4-hydroxy-3,5-dimethylphenyl) sulfone and bis(4-hydroxy-3-phenylphenyl) sulfone.

Examples of compound (6) include 2,2-bis(4-hydroxyphenyl) propane, 2,2-bis(4-hydroxyphenyl) hexafluoropropane, bis(4-hydroxyphenyl) sulfide, bis(4-hydroxy-3-methylphenyl) sulfide and bis(4-hydroxyphenyl) ether.

Examples of compound (7) include hydroquinone, resorcinol, catechol, phenyl hydroquinone, 4,4'-dihydroxybiphenyl, 2,2'-dihydroxybiphenyl, 3,5,3',5'-tetramethyl-4,4'-dihydroxybiphenyl, 2,2'-diphenyl-4,4'-dihydroxybiphenyl and 4,4'-dihydroxy-p-quaterphenyl. Among these, hydroquinone, resorcinol, catechol, phenyl hydroquinone, 2,2'-dihydroxybiphenyl, 3,5,3',5'-tetramethyl-4,4'-dihydroxybiphenyl, 2,2'-diphenyl-4,4'-dihydroxybiphenyl and 4,4'-dihydroxy-p-quaterphenyl are preferred.

An example of an aromatic dihalogenosulfone compound other than compound (4) is 4,4'-bis(4-chlorophenylsulfonyl) biphenyl.

In the present embodiment, some or all of the aromatic dihalogenosulfone compound and the aromatic dihydroxy compound may be replaced with a compound having a halogeno group and a hydroxy group in the molecule, such as 4-hydroxy-4'-(4-chlorophenylsulfonyl)biphenyl.

In the present embodiment, the aromatic dihalogenosulfone compound and the aromatic dihydroxy compound may each be a single type used alone or may be a combination of two or more types, in accordance with the type of aromatic polysulfone that is sought.

The polycondensation of the aromatic dihalogenosulfone compound and the aromatic dihydroxy compound is preferably performed by using an alkali metal salt of carbonic acid as the base. The reaction is preferably carried out in an organic solvent as the polycondensation solvent, and it is more preferably carried out in an organic solvent using an alkali metal salt of carbonic acid as the base.

The alkali metal salt of carbonic acid may be an alkali carbonate (carbonic acid salt of an alkali metal), which is a normal salt, an alkali bicarbonate (alkali hydrogencarbonate, hydrogencarbonate of an alkali metal), which is an acidic salt, or a mixture thereof (alkali carbonate and alkali bicarbonate). Examples of preferred alkali carbonates include sodium carbonate and potassium carbonate. Examples of preferred alkali bicarbonates include sodium bicarbonate (sodium hydrogencarbonate) and potassium bicarbonate (sodium hydrogencarbonate). In the present invention, the base may be a single type used alone or may be a combination of two or more types.

The polycondensation of the aromatic dihalogenosulfone compound and the aromatic dihydroxy compound is preferably performed using compound A as the organic solvent.

In the method for producing the composition according to the present embodiment, as a first step, the aromatic dihalogenosulfone compound and the aromatic dihydroxy compound are dissolved in compound A. As a second step, an alkali metal salt of carbonic acid is added to the solution obtained in the first step, thereby inducing a polycondensation reaction between the aromatic dihalogenosulfone compound and the aromatic dihydroxy compound. As a third step, unreacted bases, byproducts (halogenated alkalis when an alkali metal salt is used as the base), and excess compound A are removed from the reaction mixture obtained in the second step, thereby yielding the composition.

The dissolution temperature during the first step should preferably be no lower than 40° C. and no higher than 180° C. The polycondensation reaction temperature during the second step should preferably be no lower than 180° C. and no higher than 400° C. Assuming that no side reactions occur, the higher the polycondensation temperature is, the faster the desired polycondensation progresses, thus making the degree of polymerization of the resulting aromatic polysulfone higher, as a result of which the reduced viscosity of the aromatic polysulfone tends to be higher. However, in actuality, side reactions similar to the above tend to occur as the polycondensation temperature becomes higher, and these side reactions cause the degree of polymerization of the resulting aromatic polysulfone to decrease. Thus, the polycondensation temperature must be adjusted so that an aromatic polysulfone having a predetermined reduced viscosity can be obtained, taking the degree of these side reactions into consideration. The predetermined reduced viscosity may be a reduced viscosity within the range from at least 0.30 to at most 0.80, which is a preferred range, or within the range from at least 0.40 to at most 0.80, which is a more preferred range.

The blending ratio of the aromatic dihydrogenosulfone compound with respect to the aromatic dihydroxy compound is preferably at least 80 mol % and at most 120 mol %, and more preferably at least 90 mol % and at most 110 mol %.

The ratio of the alkali metal salt of carbonic acid used with respect to the aromatic dihydroxy compound is preferably at least 90 mol % and at most 130 mol %, more preferably at least 95 mol % and at most 120 mol % in terms of the alkali metal.

Assuming that no side reactions occur, the higher the ratio of the alkali metal salt of the carbonic acid that is used, the faster the desired polycondensation progresses, thus making the degree of polymerization of the resulting aromatic polysulfone higher, as a result of which the reduced viscosity of the aromatic polysulfone tends to be higher.

However, in actuality, side reactions similar to the above tend to occur as the ratio of the alkali metal salt of the carbonic acid that is used becomes higher, and these side reactions cause the degree of polymerization of the resulting aromatic polysulfone to decrease. Thus, the ratio of the alkali metal salt of the carbonic acid that is used must be adjusted so that an aromatic polysulfone having a predetermined reduced viscosity can be obtained, taking the degree of these side reactions into consideration.

The polycondensation in the second step may normally be performed by gradually raising the temperature while removing water that is generated as a byproduct, and after the reflux temperature of compound A has been reached, further maintaining the temperature, preferably for at least 1 hour and at most 50 hours, and more preferably at least 2 hours and at most 30 hours. Assuming that no side reactions occur, as the polycondensation time becomes longer, the desired polycondensation progresses further, so the degree of polymerization of the resulting aromatic polysulfone becomes higher, as a result of which the reduced viscosity of the aromatic polysulfone tends to be higher. However, in actuality, side reactions similar to the above tend to progress as the polycondensation time becomes longer, and these side reactions cause the degree of polymerization of the resulting aromatic polysulfone to decrease. Thus, the polycondensation time must be adjusted so that an aromatic pollysulfone having a predetermined reduced viscosity can be obtained, taking the degree of these side reactions into consideration.

In the third step, the unreacted alkali metal salts of the carbonic acid and halogenated alkalis generated as byproducts are removed, by filtration, extraction, centrifugation or the like, from the reaction mixture obtained in the second step, thereby resulting in a solution obtained by dissolving the aromatic polysulfone in compound A. Next, the excess is removed from this solution while leaving a predetermined amount of compound A, thereby resulting in the aromatic polysulfone composition.

In the present production method, compound A may, for example, be directly reduced in the aromatic polysulfone solution under reduced pressure or under compression. Preferably, the above-mentioned solution is mixed with a poor solvent of the aromatic polysulfone so as to induce the precipitation of the aromatic polysulfone, and compound A is removed by filtration, centrifugation or the like. By further repeatedly washing the above-mentioned precipitate with the poor solvent, the aromatic polysulfone composition may be obtained.

Herebelow, an example of a method for adjusting the amount of compound A contained in the composition according to the present embodiment will be explained in detail.

The aromatic polysulfone that has precipitated in the poor solvent is present, in the poor solvent, as a mixed precipitate including the aromatic polysulfone and compound A. For this reason, when the solution (aromatic polysulfone solution and poor solvent) in which the aromatic polysulfone has precipitated is filtered or centrifuged, the mixed precipitate and the solvent (compound A and poor solvent) are separated, and a mixed precipitate is obtained.

When the resulting mixed precipitate is dispersed in the poor solvent, compound A is eluted from the mixed precipitate into the poor solvent surrounding the mixed precipitate. At the same time, the poor solvent surrounding the mixed precipitate penetrates into the mixed precipitate. This transfer of the poor solvent and compound A continues, in the dispersion system wherein the mixed precipitate has been dispersed in the poor solvent, until the concentration of compound A becomes the same both in the mixed precipitate and in the dispersion medium surrounding the mixed precipitate, in other words, until the mixed precipitate and the dispersion medium surrounding the mixed precipitate reach equilibrium.

At this time, if the amount of compound A contained in the mixed precipitate and the amount of the poor solvent used for washing are known, then the amount of compound A remaining in the mixed precipitate when the transfer of the solvent (compound A and poor solvent) in the dispersion system reaches equilibrium can be estimated on the basis of these amounts.

For this reason, the amount of compound A remaining in the mixed precipitate can be controlled by controlling the amount of the poor solvent used for washing. By pre-dissolving compound A in the poor solvent used for washing, it is possible to suppress the amount of compound A eluted from the mixed precipitate into the surrounding poor solvent when the transfer of the solvent in the dispersion system reaches equilibrium, compared to the case in which washing is performed using only the poor solvent, thereby allowing a large amount of compound A to remain in the mixed precipitate.

In the present production method, the amount of the poor solvent used, the washing time, the washing temperature, the number of washes and the stirring speed can be adjusted so as to obtain an aromatic polysulfone composition containing a predetermined amount of compound A. For example, the amount of compound A that is contained can be decreased by increasing the amount of the poor solvent used, prolonging the washing time until equilibrium is reached, raising the washing temperature, increasing the number of washes or raising the stirring speed. It is possible to combine two or more of the above operations.

Examples of poor solvents of the aromatic polysulfone include methanol, ethanol, isopropyl alcohol, hexane, heptane and water, among which water and methanol are preferred for being available at a low cost.

In the present embodiment, the poor solvent of the aromatic polysulfone may be a single type used alone or a combination of two or more types.

(Resin Film Production Method)

The resin film according to the present embodiment has a thickness of less than 100 μm, preferably at least 3 μm and less than 100 μm, and more preferably at least 3 μm and at most 10 μm. Due to the thickness of the resin film being within the above-mentioned range, the resin film can be stably produced. The thickness of the resin film in the present specification can be determined by using a micrometer to measure three arbitrary points on the resin film, and calculating the average value thereof.

The method for producing the resin film according to the present embodiment may, for example, be a method for producing the resin film by means of solution casting method or melt extrusion method using the above-mentioned composition.

(Solution Casting Method)

One aspect of the present invention is the resin film production method indicated below.

<1> A resin film production method including:
a step of applying, to a substrate, an aromatic polysulfone composition including an aromatic polysulfone and an organic compound having a boiling point no lower than 250° C. and no higher than 400° C.; and
a step of drying and heating the applied aromatic polysulfone composition; wherein the organic compound is contained in an amount of at least 500 ppm and at most 4000 ppm relative to the mass of the aromatic polysulfone, and the resin film has a thickness of less than 100 μm.

<2> The resin film production method according to <1>, wherein the aromatic polysulfone composition is an aromatic polysulfone composition containing at least 500 ppm and at most 5000 ppm of the organic compound relative to the mass of the aromatic polysulfone.

The aromatic polysulfone composition containing at least 500 ppm and at most 5000 ppm of the organic compound relative to the mass of the aromatic polysulfone refers to the aromatic polysulfone composition prior to the step of being applied to the substrate.

Herebelow, an example of a method in which the resin film is produced by solution casting method using the above-mentioned composition will be explained.

First, the composition according to the present embodiment is dissolved in a solvent to produce a solution. The solvent is preferably, for example, an aprotic polar solvent. Examples of aprotic polar solvents include, for example, sulfoxides such as dimethyl sulfoxide; amides such as dimethyl formamide, dimethyl acetamide and N-methyl-2-pyrrolidone; sulfones such as dimethyl sulfone, diethyl sulfone and diisopropyl sulfone; and compounds having a urea backbone in which a hydrogen atom bonded to a nitrogen atom may be substituted, such as 1,3-dimethyl-2-imidazolidinone and 1,3-diethyl-2-imidazolidinone. The method for dissolving the composition in the solvent is not particularly limited, and a conventionally known method may be used.

In the present embodiment, the amount of compound A that is contained when a resin film is formed can be adjusted by adding compound A to the above-mentioned solution. For example, a resin film could be produced as a test, and when a desired amount of compound A is not contained in this resin film, a desired amount of compound A can be added to the solution used for production to thereby adjust the amount of compound A that is contained.

The solution according to the present embodiment may contain a known filler or additive as long as the effects of the present invention are not compromised. The filler is preferably an inorganic filler for being able to further improve the mechanical strength of the resulting resin film.

The resulting solution may be filtered by means of a filter, as needed, so as to remove fine contaminants contained in the solution.

Next, the resulting solution is applied to a base material to form a coating film. The application method may be, for example, roller coating, dip coating, spray coating, spin coating, curtain coating, slot coating or screen printing.

Next, the solvent remaining on the coating film is removed by surface-drying and heating the coating film on the base material. In order to increase the smoothness of the coating film surface, the heating is preferably performed in the two steps of surface-drying and heating. The drying method may be a method of drying by heating, reducing pressure or blowing. Of these, drying by heating is preferred for having excellent production efficiency and ease of handling, and drying by heating while blowing is more preferred.

The drying temperature of the coating film surface is preferably 60 to 160° C., more preferably 60 to 150° C., and even more preferably 60 to 140° C. If the drying temperature is in the aforementioned ranges, defects do not tend to occur on the coating film surface and not much time is required for drying, so the productivity is not easily lowered.

After being dried, the coating film is heated. During the heat treatment, the treatment temperature is preferably 200 to 350° C., the lower limit of the treatment temperature is preferably no lower than 250° C., and more preferably no lower than 280° C. On the other hand, the upper limit of the treatment temperature is preferably no higher than 340° C., and more preferably no higher than 330° C. In other words, the heat treatment temperature is preferably 250 to 340° C., and more preferably 280 to 330° C. The treatment time is within the range from 10 minutes to 15 hours. The lower limit of the treatment time is more preferably at least 20 minutes, and it is particularly preferable for the treatment time to be at least 40 minutes. On the other hand, the upper limit of the treatment time is more preferably at most 12 hours, and it is particularly preferable for the treatment time to be at most 10 hours. In other words, the treatment time is preferably within the range from 20 minutes to 12 hours, and more preferably within the range from 40 minutes to 10 hours.

The heat treatment in the present embodiment is preferably performed in a space filled with an inert gas such as nitrogen, argon or neon, or in a vacuum.

The coating film produced on the base material in this way is stripped from the base material to obtain a resin film.

The present embodiment may include an inspection step of measuring the amount of compound A contained in the resulting resin film relative to the mass of the aromatic polysulfone, and selecting only the resin films containing a predetermined amount. In the present specification, the amount of compound A contained in the resin film relative to the aromatic polysulfone may be measured by means of the method described in the examples below. The predetermined amount that is contained may be at least 500 ppm and at most 4000 ppm, or at least 600 ppm and at most 3500 ppm, which are the preferred ranges for the amount of compound A contained in the resin film relative to the mass of the aromatic polysulfone, and should more preferably be within the range from at least 700 ppm to at most 3200 ppm, and even more preferably within the range from at least 750 ppm and at most 3000 ppm.

(Melt Extrusion Method)

One aspect of the present invention is the resin film production method indicated below.

<1> A resin film production method including:

a step of melt-kneading an aromatic polysulfone composition including an aromatic polysulfone and an organic compound having a boiling point no lower than 250° C. and no higher than 400° C.;

a step of molding a precursor film by extruding the melted aromatic polysulfone composition; and a step of stretching the precursor film; wherein the organic compound is contained in an amount of at least 500 ppm and at most 4000 ppm relative to the mass of the aromatic polysulfone, and the resin film has a thickness of less than 100 μm.

<2> The resin film production method according to <1>, wherein the aromatic polysulfone composition is an aromatic polysulfone composition containing at least 500 ppm and at most 5000 ppm of the organic compound relative to the mass of the aromatic polysulfone.

The aromatic polysulfone composition containing at least 500 ppm and at most 5000 ppm of the organic compound relative to the mass of the aromatic polysulfone refers to the aromatic polysulfone composition prior to the melt-kneading step.

Herebelow, an example of a method in which the resin film is produced by extrusion molding method using the above-mentioned composition will be explained with reference to FIG. 1.

FIG. 1 is a schematic view showing an example of the arrangement of an apparatus used when producing the resin film according to the present embodiment by means of melt extrusion method. First, the composition according to the present embodiment is melt-kneaded by means of an extrusion testing machine. As shown in FIG. 1, the melted composition is extruded by means of a coat-hanger die 1 to mold a precursor film 10. The precursor film 10 is cooled by a first cooling roller 2 and a second cooling roller 3 to produce a resin film 11.

In the present embodiment, the temperature of the coat-hanger die 1 is preferably 330 to 400° C., and more preferably 350 to 380° C. If the temperature of the coat-hanger die 1 is too low, the resin film 11 may be stretched by being pulled downward after exiting the coat-hander die 1, and the optical main axis may become aligned in the flow direction. If the temperature of the coat-hanger die 1 is too high, the temperature difference with respect to the first cooling roller 2 may become large, causing cooling wrinkles to be formed on the first cooling roller 2 and making the optical properties uneven.

In the present embodiment, the temperatures of the first cooling roller 2 and the second cooling roller 3 are controlled to be uniform. The temperature of the first cooling roller 2 is preferably lower than the temperature of the coat-hanger die 1. The temperature of the second cooling roller 3 is preferably lower than the temperature of the first cooling roller 2.

In the present embodiment, the speeds of the first cooling roller 2 and the second cooling roller 3 are constant, and are respectively adjusted according to the thickness of the precursor film 10. In this way, the resin film according to the present embodiment is obtained.

The present embodiment may include an inspection step of measuring the amount of compound A contained in the resulting resin film relative to the mass of the aromatic polysulfone, and selecting only the resin films containing a predetermined amount.

According to the present embodiment, a resin film having excellent mechanical strength, such as toughness, is provided.

Laminated Film

The laminated film according to the present embodiment has a layer including the above-mentioned resin film, and a layer including a conductor. The laminated film has a structure in which a layer including the resin film is laminated onto at least one surface of the layer including the conductor. If the laminated film is required to have particularly high insulating properties, it is more preferable for the resin film to be thicker.

The laminated film may have one or more, respectively, of the layer including a conductor and the layer including a resin film. If there are two or more of the layer including a conductor or the layer including a resin film, a structure in which the layers including a conductor and the layers including a resin film are laminated in alternating fashion is used.

The thickness of the resin film is not particularly limited, but preferably should be at least 3 μm and less than 100 μm, more preferably at least 3 μm and at most 10 μm.

In the present embodiment, an example of the layer including a conductor is a metal foil. The metal foil may, for example, be a metal foil including gold, silver, copper, aluminum or nickel, among which copper foil is preferred. The thickness of the metal foil is preferably 5 to 100 μm, more preferably 5 to 60 μm, and even more preferably 5 to 30 μm.

Herebelow, an example of a method for producing a laminated film according to the present embodiment will be explained.

The method for producing the laminated film according to the present embodiment may be a method of bonding together a resin film and a layer including a conductor. Another method for producing the laminated film is a method of directly applying a solution containing the composition to the layer including a conductor, thereby forming the resin film on the layer including a conductor. In this case, the laminated film can be easily produced in the same manner as the method for producing a resin film by means of solution casting method, other than the fact that the layer including a conductor is used as the base material and the fact that the coating film is not stripped from the base material.

In the laminated film obtained in this way, the surface of the resin film opposite to the layer including the conductor may be treated by polishing, treated with a chemical solution such as an acid or an oxidizing agent, treated by ultraviolet irradiation or treated by plasma irradiation, as needed.

According to the present embodiment, a laminated film having excellent mechanical strength, using the above-mentioned resin film, is provided.

Substrate for Flexible Printed Wiring Board

The substrate for a flexible printed wiring board (hereinafter sometimes referred to as an "FPC") according to the present embodiment includes the above-mentioned laminated film. In other words, the substrate for a flexible printed wiring board has a structure similar to that of the laminated film, which has the layer including a resin film laminated on one surface of the layer including a conductor. The flexible printed wiring board is obtained by forming a conductive pattern, by etching or the like, on the substrate for a flexible printed wiring board, on the surface of the layer including a conductor opposite to the surface on which the layer including a resin film is laminated, then laminating a coverlay, which is an insulator including a resin material, over the conductive pattern. The conductive pattern is a pattern formed by a conductive material on the flexible printed wiring board, forming part of the circuitry. Etching is a method for forming the conductive pattern by chemically or electrically removing unwanted parts of the conductor. A coverlay is a film that covers the conductor portions of the flexible printed wiring board for insulation and protection. Examples of resin materials used as coverlays include polyimide films and the resin film of the present invention.

When particularly high insulation properties are sought in an FPC application, the resin film is preferably made thicker.

According to the present embodiment, a substrate for a flexible printed wiring board having excellent mechanical strength and including the above-mentioned resin film is provided.

Modification Examples

The technical scope of the present invention is not limited to the above-mentioned embodiments, and various changes may be made within a range not compromising the effects of the present invention.

Aside from substrates for flexible printed wiring boards, the resin film according to the present embodiment may be used in films for multilayer printed wiring boards for use in semiconductor packages or motherboards, formed by build-up processes or the like, films for use in tape-automated bonding, films for use as tagging tape, wrapping films for microwave heating, films for electromagnetic-wave shielding, high-frequency printed wiring boards, high-frequency cables, communication device circuits and substrates for packages.

EXAMPLES

Herebelow, the present invention will be explained in detail by referring to examples and comparative examples, but the present invention is not to be construed as being limited thereto.

Measurements of the reduced viscosity of the aromatic polysulfones, quantitative analyses of compound A contained in the compositions, quantitative analyses of compound A contained in the resin films and evaluations of the toughness of the resin films were performed, respectively, by the following methods.

Measurement of Reduced Viscosity of Aromatic Polysulfones

Approximately 1 g of an aromatic polysulfone was dissolved in N,N-dimethyl formamide (special-grade reagent), the volume thereof was set to 1 dL, and the viscosity ($\eta$) of this solution was measured at 25° C. using an Ostwald viscometer. Additionally, the viscosity ($\eta_o$) of the solvent, N,N-dimethyl formamide, was measured at 25° C. using the Ostwald viscometer. The viscosity ($\eta$) of the aromatic polysulfone solution and the viscosity ($\eta_o$) of N,N-dimethyl formamide were used to determine the specific viscosity (($\eta-\eta_o$)/$\eta_o$), and this value was divided by the concentration (approximately 1 g/dL) of the aromatic polysulfone solution to thereby determine the reduced viscosity (dL/g) of the aromatic polysulfone.

Normally, a higher reduced viscosity value can be considered to correspond to a higher molecular weight.

Quantitative Analysis of Compound A Contained in Composition

A known amount of the composition and a known amount of methanol were mixed for two or more hours at room temperature. The concentration of compound A in the methanol was calculated from the gas chromatography area ratio. Next, the amount of compound A contained in the composition was calculated from the amounts of the composition and the methanol.

Quantitative Analysis of Compound a Contained in Resin Film

The resin film was pulverized so that the short sides thereof were at most 0.5 mm, and a known amount of the pulverized resin film was mixed, for at least 4 hours at room temperature, with a known amount of a mixed solution obtained by mixing acetone and methanol at a volume ratio of 1:1. The concentration of compound A in the mixed solution was calculated from the gas chromatography area ratio. Next, the amount of compound A contained in the resin film was calculated from the amounts of the resin film and the mixed solution.

Production Example 1

100.1 g of 4,4'-dihydroxydiphenyl sulfone, 119.0 g of 4,4'-dichlorodiphenyl sulfone and 194.3 g of diphenyl sulfone (hereinafter sometimes referred to as "DPS"), as compound A, were placed in a polymerization tank having a stirrer, a nitrogen feeding pipe, a thermometer and a condenser having a receiver appended to the tip thereof. While supplying nitrogen gas to this mixed solution, the temperature was raised to 180° C., and 57.5 g of potassium carbonate were further added. This solution was gradually heated to 290° C. and allowed to react for 4 hours at 290° C. Next, the resulting mixed reaction solution was cooled to room temperature, allowed to solidify, finely pulverized, then washed several times with warm water and a mixed solvent of acetone and methanol, thereby washing away unreacted potassium carbonate and potassium chloride byproducts. After being washed, the product was heat-dried at 150° C., thereby resulting in a mixed precipitate (aromatic polysulfone and DPS) in the form of a powder. The reduced viscosity of the resulting aromatic polysulfone was 0.41 dL/g and the amount of DPS relative to the mass of the aromatic polysulfone was 300 ppm.

Example 1

60 g of the mixed precipitate obtained in Production Example 1 and 240 g of N-methyl-2-pyrrolidone (hereinafter sometimes referred to as "NMP") were placed in a 500 mL separable flask, and stirred for 2 hours at 60° C. to obtain a pale yellow aromatic polysulfone solution. This solution was adjusted by adding DPS so as to contain DPS in the amount of 800 ppm relative to the mass of the aromatic polysulfone. The solution to which DPS was added was applied, using a film applicator, to a glass plate having a thickness of 3 mm, and dried at 60° C., using a high-temperature hot-air dryer, to form a coating film. This coating film was heated at 250° C. while supplying nitrogen to form a resin film having a thickness of 8 m on the glass plate. By stripping this resin film from the glass plate, the resin film of Example 1 was obtained. The thickness of the resin film was measured by means of a "Micrometer PMU 150-25MJ" (manufactured by Mitutoyo Corporation). Additionally, the measurements were made at three arbitrary points on the resin film, and the average value thereof was 8 μm.

Example 2

The resin film of Example 2 was obtained in the same manner as Example 1, except that, by adding DPS to the aromatic polysulfone solution, the solution was adjusted so as to contain DPS in the amount of 3000 ppm relative to the mass of the aromatic polysulfone.

Example 3

75 g of the mixed precipitate obtained in Production Example 1 and 225 g of NMP were placed in a 500 mL separable flask, and stirred for 2 hours at 60° C. to obtain a pale yellow aromatic polysulfone solution. This solution was adjusted by adding DPS so as to contain DPS in the amount of 800 ppm relative to the mass of the aromatic polysulfone. The solution to which DPS was added was applied, using a film applicator, to a glass plate having a thickness of 3 mm, and dried at 60° C., using a high-temperature hot-air dryer, to form a coating film. This coating film was heated at 250° C. while supplying nitrogen to form a resin film having a thickness of 75 m on the glass plate. By stripping this resin film from the glass plate, the resin film of Example 3 was obtained. The thickness of the resin film was measured by means of a "Micrometer PMU 150-25MJ" (manufactured by Mitutoyo Corporation). Additionally, the measurements were made at three arbitrary points on the resin film, and the average value thereof was 8 μm.

Example 4

The resin film of Example 4 was obtained in the same manner as Example 3, except that, by adding DPS to the aromatic polysulfone solution, the solution was adjusted so as to contain DPS in the amount of 3000 ppm relative to the mass of the aromatic polysulfone.

Comparative Example 1

The resin film of Comparative Example 1 was obtained in the same manner as Example 1, except that DPS was not added to the aromatic polysulfone solution.

Comparative Example 2

The resin film of Comparative Example 2 was obtained in the same manner as Example 1, except that, by adding DPS to the aromatic polysulfone solution, the solution was adjusted so as to contain DPS in the amount of 5000 ppm relative to the mass of the aromatic polysulfone.

Comparative Example 3

The resin film of Comparative Example 3 was obtained in the same manner as Example 3, except that DPS was not added to the aromatic polysulfone solution.

Comparative Example 4

The resin film of Comparative Example 4 was obtained in the same manner as Example 3, except that, by adding DPS to the aromatic polysulfone solution, the solution was adjusted so as to contain DPS in the amount of 5000 ppm relative to the mass of the aromatic polysulfone.

[Resin Film Toughness Evaluation]

The toughness of each of the resin films obtained in the examples and the comparative examples was evaluated by means of a JIS P 8115 MIT testing machine, and the number of folds until the resin films broken were determined. In these evaluations, a resin film enduring more folds means that the resin film has excellent toughness. Toughness evaluations of the resin films in Example 1, Example 2, Comparative Example 1 and Comparative Example 2 were performed by the method indicated in Evaluation 1. Toughness evaluations of the resin films in Example 3, Example 4, Comparative Example 3 and Comparative Example 4 were performed by the method indicated in Evaluation 2.

(Evaluation 1)

13 cm×1 cm testing pieces were cut from the resin films of Example 1, Example 2, Comparative Example 1 and Comparative Example 2. These testing pieces were used to perform folding tests under conditions of a bending radius of 3.0 mm and a load of 2.0 N, using an MIT fatigue resistance tester (manufactured by Toyo Seiki Co., Ltd.), and the numbers of folds until the testing pieces broke were determined. The same test was performed three times and the average value thereof was calculated.

(Evaluation 2)

Evaluations were performed in the same manner as Evaluation 1, except that the resin films of Example 3, Example 4, Comparative Example 3 and Comparative Example 4 were used, and the bending radius was set to 0.38 mm and the load was set to 4.9 N.

The amounts of DPS contained relative to the mass of the aromatic polysulfone in the compositions according to the examples and the comparative examples, the amounts of DPS contained relative to the mass of the aromatic polysulfone in the resin films, the thicknesses of the resin films and the numbers of folds endured by the resin films are indicated in Tables 2 and 3.

TABLE 2

| | DPS Content Relative to Mass of Aromatic Polysulfone in Composition (ppm) | DPS Content Relative to Mass of Aromatic Polysulfone in Resin Film (ppm) | Thickness of Resin Film (μm) | Number of Folds of Resin Film |
|---|---|---|---|---|
| Example 1 | 800 | 800 | 8 | 4208 |
| Example 2 | 3000 | 2900 | 8 | 5206 |
| Comparative Example 1 | 300 | 280 | 8 | 1088 |
| Comparative Example 2 | 5000 | 4850 | 8 | 1998 |

TABLE 3

| | DPS Content Relative to Mass of Aromatic Polysulfone in Composition (ppm) | DPS Content Relative to Mass of Aromatic Polysulfone in Resin Film (ppm) | Thickness of Resin Film (μm) | Number of Folds of Resin Film |
|---|---|---|---|---|
| Example 3 | 800 | 750 | 75 | 1221 |
| Example 4 | 3000 | 3000 | 75 | 1362 |
| Comparative Example 3 | 300 | 300 | 75 | 832 |
| Comparative Example 4 | 5000 | 4900 | 75 | 934 |

In the resin films of Examples 1 and 2 shown in Table 2, the ratios of DPS relative to the mass of the aromatic polysulfone were at least 500 ppm and at most 4000 ppm, so the resulting resin films had excellent toughness.

In the resin films of Examples 3 and 4 shown in Table 3, the amounts of DPS relative to the mass of the aromatic polysulfone were likewise at least 500 ppm and at most 4000 ppm, so the resulting resin films had excellent toughness. All of the resin films obtained in the above-mentioned examples had thicknesses of less than 100 μm, and therefore had excellent toughness irrespective of the thickness of the resin films.

On the other hand, in the resin film of Comparative Example 1 shown in Table 2, the amount of the DPS relative to the mass of the aromatic polysulfone was less than 500 ppm, so the resulting resin film had inferior toughness. In the resin film of Comparative Example 2, the amount of DPS relative to the mass of the aromatic polysulfone exceeded 4000 ppm, so the resulting resin film had inferior toughness.

In the resin film of Comparative Example 3 shown in Table 3, the amount of the DPS relative to the mass of the aromatic polysulfone was likewise less than 500 ppm, so the resulting resin film had inferior toughness. In the resin film of Comparative Example 4, the amount of DPS relative to the mass of the aromatic polysulfone exceeded 4000 ppm, so the resulting resin film had inferior toughness.

Based on the above results, it was verified that the present invention is useful.

INDUSTRIAL APPLICABILITY

The resin film having an aromatic polysulfone as a forming material, and the laminated film and the substrate for a flexible printed wiring board containing the resin film according to the present invention have high toughness and excellent mechanical strength, and are thus useful.

REFERENCE SIGNS LIST

1 Coat-hanger die
2 First cooling roller
3 Second cooling roller
10 Precursor film
11 Resin film

The invention claimed is:

1. A resin film having an aromatic polysulfone as a forming material, wherein:
the resin film has a thickness of less than 100 μm;
the resin film further contains an organic compound having a boiling point no lower than 250° C. and no higher than 400° C.;
the organic compound is contained in an amount of at least 500 ppm and at most 4000 ppm relative to the mass of the aromatic polysulfone; and
the organic compound has, as Hansen solubility parameters, a dispersion parameter δD (units: $MPa^{0.5}$) of at least 16.0 and at most 22.0, a polarity parameter δP (units: $MPa^{0.5}$) of at least 12.0 and at most 16.4, and a hydrogen bonding parameter δH (units: $MPa^{0.5}$) of at least 3.0 and at most 12.0.

2. The resin film according to claim 1, wherein the aromatic polysulfone has repeating units expressed by formula (1), the repeating units expressed by formula (1) constituting 80 to 100 mol % of a total amount of all repeating units constituting the aromatic polysulfone:

-$Ph^1$-$SO_2$-$Ph^2$-O—     (1)

where, in formula (1), $Ph^1$ and $Ph^2$ represent phenylene groups, in which one or more hydrogen atoms that bind to the phenylene groups may, independently of each other, be substituted with an alkyl group having 1 to 10 carbon atoms, an aryl group having 6 to 20 carbon atoms, or a halogen atom.

3. The resin film according to claim 1, wherein the organic compound is an aprotic polar solvent.

4. The resin film according to claim 1, wherein the organic compound is diphenyl sulfone.

5. A laminated film having a layer comprising the resin film according to claim 1, and a layer comprising a conductor.

6. A substrate for a flexible printed wiring board, comprising the laminated film according to claim 5.

* * * * *